(12) United States Patent
Yan et al.

(10) Patent No.: US 10,818,571 B2
(45) Date of Patent: Oct. 27, 2020

(54) PACKAGING STRUCTURE FOR POWER MODULE

(71) Applicant: Delta Electronics (Shanghai) Co.,Ltd., Shanghai (CN)

(72) Inventors: Chao Yan, Shanghai (CN); Yiwen Lu, Shanghai (CN); Jun Liu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/550,279

(22) Filed: Aug. 25, 2019

(65) Prior Publication Data
US 2020/0161207 A1    May 21, 2020

(30) Foreign Application Priority Data
Nov. 19, 2018 (CN) .......................... 2018 1 1374937

(51) Int. Cl.
*H01L 23/367* (2006.01)
*H01L 23/498* (2006.01)
(Continued)

(52) U.S. Cl.
CPC ...... *H01L 23/367* (2013.01); *H01L 23/49833* (2013.01); *H01L 23/49861* (2013.01);
(Continued)

(58) Field of Classification Search
CPC ........... H01L 23/367; H01L 23/749833; H01L 23/50; H01L 23/53228; H05K 7/209
See application file for complete search history.

(56) References Cited

U.S. PATENT DOCUMENTS 5,521,435 A * 5/1996 Mizukoshi .............. H01L 23/24
257/698
6,687,108 B1 * 2/2004 Anthony .................. H01C 1/14
257/E23.067
(Continued)

FOREIGN PATENT DOCUMENTS

CN    102340233 B    5/2014
CN    104900546 A    9/2015
(Continued)

*Primary Examiner* — Seahvosh Nikmanesh
(74) *Attorney, Agent, or Firm* — CKC & Partners Co., LLC

(57) ABSTRACT

The present application discloses a packaging structure for a power module, comprising: a heat dissipation substrate; at least one first power device disposed on a first substrate having an insulating layer, the first substrate disposed on the heat dissipating substrate; and at least one second power device including a jumping electrode having a jumping potential, wherein the at least one second power device is disposed on at least one second substrate having an insulating layer, and the at least one second substrate is disposed on the first substrate, to reduce a parasitic capacitance between the jumping electrode and the heat dissipation substrate. The packaging structure for the power module according to the present application can reduce the parasitic capacitance between the jumping electrode of the power module and the heat dissipation substrate, thereby greatly reducing the EMI noise of the power module in operation.

17 Claims, 5 Drawing Sheets

(51) Int. Cl.
*H01L 23/50* (2006.01)
*H01L 23/532* (2006.01)
*H05K 7/20* (2006.01)

(52) U.S. Cl.
CPC ........ *H01L 23/50* (2013.01); *H01L 23/53228* (2013.01); *H05K 7/209* (2013.01)

(56) References Cited

U.S. PATENT DOCUMENTS

| | | | |
|---|---|---|---|
| 10,074,590 B1* | 9/2018 | Pavier | H01L 23/49524 |
| 2005/0280998 A1* | 12/2005 | Lin | H05K 7/209 |
| | | | 361/704 |
| 2006/0196424 A1* | 9/2006 | Swallow | H05H 1/46 |
| | | | 118/723 E |
| 2011/0073999 A1* | 3/2011 | Niu | H01L 24/37 |
| | | | 257/675 |
| 2013/0314879 A1* | 11/2013 | Yin | H01L 23/49861 |
| | | | 361/728 |
| 2016/0197033 A1* | 7/2016 | Lin | H05K 3/4697 |
| | | | 257/737 |
| 2019/0393193 A1* | 12/2019 | Eid | H01L 24/73 |

FOREIGN PATENT DOCUMENTS

| | | |
|---|---|---|
| EP | 2750184 A1 | 7/2014 |
| EP | 8113223 A1 | 1/2017 |
| JP | 2005217167 A | 8/2005 |
| WO | 2013085839 A2 | 6/2013 |
| WO | 2016188909 A | 12/2016 |

* cited by examiner

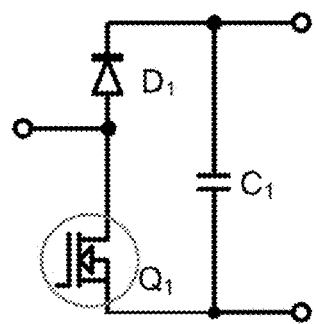
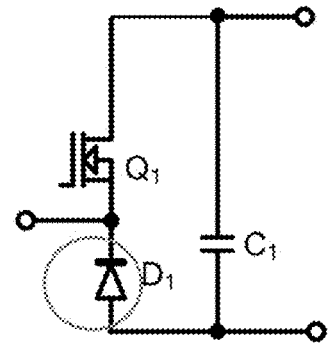
Fig. 7A  Fig. 7B
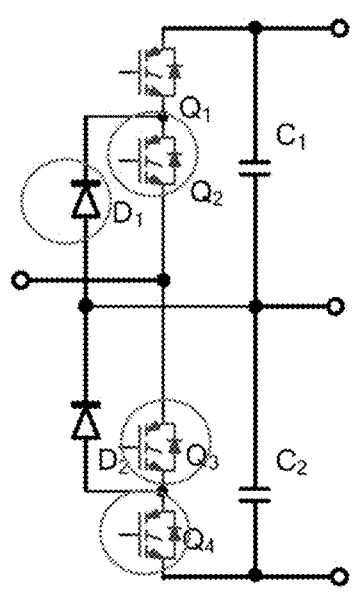
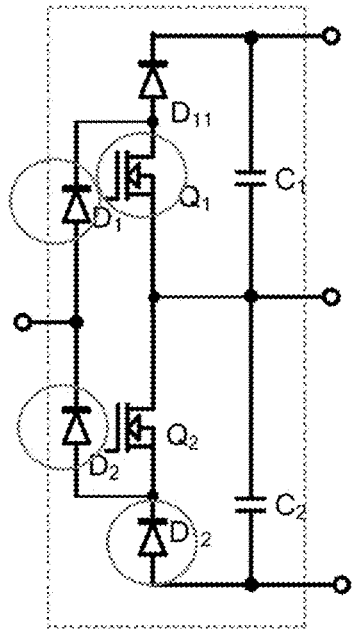
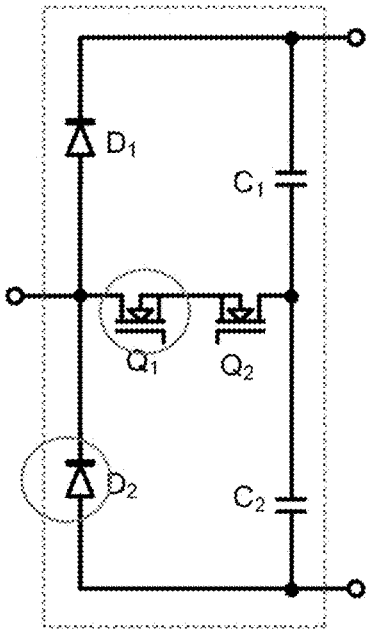
Fig. 8A  Fig. 8B  Fig. 8C

PACKAGING STRUCTURE FOR POWER MODULE

CROSS-REFERENCE TO RELATED APPLICATIONS

This non-provisional application claims priority under 35 U.S.C. § 119(a) on Patent Application No. 201811374937.X filed in P.R. China on Nov. 19, 2018, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

TECHNICAL FIELD

The present application relates to a packaging structure for a power module, and particularly to a packaging structure for a power module with low EMI (Electro-Magnetic Interference) noise.

BACKGROUND ART

With the development of power electronic devices toward modularization and intelligentization, the integration levels and power densities of various types of IC chips are increasing. Power semiconductor devices are developing toward high temperature, high frequency, low power consumption, high power capacity, intelligentization and systematization. At the same time, new structures and new processes have been developed continuously, and power semiconductor devices represented by SiC have been widely used, especially in some applications where a relatively large power is required. The range of applications of SiC power modules is expanded.

The separated devices are usually packaged by a standardized package, which can guarantee high reliability and low cost, but may have large parasitic parameter therein, such that it is unsuitable for parallel application. When solving the problems of the packaging structure for a module, the interconnection between a chip inside the module and a substrate, and the like, power electronic packaging technology can reduce the unfavorable parasitic parameters of various components while having a higher current carrying capacity, reducing the volume and weight of the module, and increasing the power density of the system.

According to the assembly process and the mounting and fixing method, the existing power module packaging may be mainly classified as: a crimping structure, a soldering structure, and a direct bonding copper (DBC) substrate structure, etc. Among them, the DBC substrate structure has great thermal fatigue stability and a high integration level.

The basic structure of an existing power semiconductor chip is shown in FIG. 1. The commonly used power semiconductor chips may comprise a metal-oxide-semiconductor field effect transistor (MOSFET), an insulated gate bipolar transistor (IGBT) and a diode. The MOSFET chip generally has a source S, a gate G, and a drain D, the IGBT chip generally has an emitter E, a gate G and a collector C, the diode chip generally has an anode A and a kathode K, and the drain D, the collector C, the kathode K of these chips are generally disposed on the bottom parts of the chips. As shown in FIG. 2, when a DBC substrate 22 is used for power module packaging, the bottom parts of these chips 23 and the DBC substrate 21 are generally soldered together, such that a parasitic capacitance $C_P$ can be formed between the drain D, the collector C or the kathode K of the power semiconductor chip and a heatsink 21.

As shown in FIG. 3, Chinese patent application CN104900546 proposes an IGBT power module packaging structure comprising a DBC substrate soldered with an IGBT chip. As described above and shown in FIG. 1, the IGBT chip has a gate G and an emitter E on the upper surface and a collector C on the lower surface, the collector C of the IGBT chip is soldered to a copper layer on the upper surface of the DBC substrate with a solder, the gate G of the IGBT chip is connected to the copper layer on the upper surface of the DBC substrate via wires, and the emitter E of the IGBT chip is connected to the copper layer on the upper surface of the DBC substrate via wires. The copper layer on the lower surface of the DBC substrate is soldered to a heat dissipation substrate with a solder, and there is a ceramic layer between the copper layer on the lower surface of the DBC substrate and the copper layer on the upper surface of the DBC substrate. Therefore, parasitic capacitances $C_P$ are formed between the collector C of the IGBT chip and the heat dissipation substrate (connected to the protective earth of the system), between the gate G of the IGBT chip and the heat dissipation substrate, and between the emitter E of the IGBT chip and the heat dissipation substrate.

According to the foregoing, none of the internal structures employed by the above packaging technologies can avoid the generation of parasitic capacitance between one or more electrodes of the power semiconductor chip and the heat dissipation substrate (i.e., a voltage static point), and thus an electromagnetic interference (EMI) problem to the entire power electronic converter may be caused by the common mode current that may be introduced by the presence of parasitic capacitance. Especially for a SiC power module, although the packaging technologies described above can effectively reduce the parasitic inductance parameter within the power device, the packaged module still has a serious problem of parasitic capacitance. One of the important reasons is that the SiC power module is required to be mounted on a heatsink (or "heatsink sheet", "heatsink substrate", which may be, for example, made from a metal material), and the bottom surface of the power module is required to be tightly attached to the heatsink, for the purpose of heat dissipation in the SiC power module. However, the potential of the heatsink is usually the protective earth for the power converter to provide a displacement current path between the internal jumping potential and the protective earth, such that it is more likely to cause an EMI (electromagnetic interference) problem.

At the same time, since the SiC power module is a high speed device, a jumping point having a jumping potential may exist within the switch of the SiC power module operating in the switching state, and the voltage change rate dv/dt of the jumping point is relatively large. Therefore, the EMI problem is particularly severe in the SiC power module, causing the SIC power module unsuitable for parallel application.

Therefore, there is a need for a new power module packaging technology that can effectively reduce the parasitic capacitance between the power module and the protective earth for the converter, thereby inhibiting the influence of common mode electromagnetic interference (EMI).

DISCLOSURE OF THE PRESENT INVENTION

In view of above, an object of the present application is to provide an improved power module packaging structure that can effectively alleviate or avoid EMI problem caused by the parasitic capacitance in the existing module packaging technologies.

In order to achieve the above object, the present application provides a packaging structure for a power module, including: a heat dissipation substrate; at least one first power device disposed on a first substrate having an insulating layer, the first substrate disposed on the heat dissipating substrate; at least one second power device including a jumping electrode having a jumping potential, wherein the at least one second power device is disposed on at least one second substrate having an insulating layer, and the at least one second substrate is disposed on the first substrate, to reduce a parasitic capacitance between the jumping electrode and the heat dissipation substrate.

In one or more embodiments of the present application, the first substrate is a DBC substrate; and the at least one second substrate is a DBC substrate.

In one or more embodiments of the present application, the first substrate further comprises two metal layers disposed on an upper surface and a lower surface of the insulating layer of the first substrate, respectively.

In one or more embodiments of the present application, the at least one second substrate further comprises two metal layers disposed on an upper surface and a lower surface of the insulating layer of the at least one second substrate, respectively.

In one or more embodiments of the present application, the insulating layer of the first substrate comprises ceramic; and the insulating layer of the at least one second substrate comprises ceramic.

In one or more embodiments of the present application, the insulating layer of the first substrate comprises AlN or SiN; and the insulating layer of the at least one second substrate comprises AlN or SiN.

In one or more embodiments of the present application, the at least one first power device is a diode chip having an anode on an upper surface of the diode chip and a kathode on a lower surface of the diode chip; or the at least one first power device is an IGBT chip having an emitter and a gate on an upper surface of the IGBT chip and a collector on a lower surface of the IGBT chip; or the at least one first power device is a MOSFET chip having a source and a gate on an upper surface of the MOSFET chip and a drain on a lower surface of the MOSFET chip.

In one or more embodiments of the present application, the at least one second power device is a diode chip having an anode on an upper surface of the diode chip and a kathode on a lower surface of the diode chip; or the at least one second power device is an IGBT chip having an emitter and a gate on an upper surface of the IGBT chip and a collector on a lower surface of the IGBT chip; or the at least one second power device is a MOSFET chip having a source and a gate on an upper surface of the MOSFET chip and a drain on a lower surface of the MOSFET chip.

In one or more embodiments of the present application, the metal layer comprises copper.

In one or more embodiments of the present application, the first substrate is soldered to the heat dissipation substrate with a solder.

In order to achieve the above object, the present application further provides a packaging structure for a power module, comprising: a heat dissipation substrate; at least one first power device; at least one second power device including a jumping electrode having a jumping potential; a carrier substrate including a first metal layer, a second metal layer, a first insulating layer, a second insulating layer and a third metal layer, the first insulating layer disposed between the first metal layer and the second metal, the second insulating layer disposed between the second metal layer and the third metal layer; wherein the first metal layer is disposed on the heat dissipation substrate, the at least one first power device is disposed on the second metal layer, and the at least one second power device is disposed on the third metal layer, to reduce a parasitic capacitance between the jumping electrode and the heat dissipation substrate.

In one or more embodiments of the present application, a portion of an upper surface of the second metal layer has a convex surface, the second insulating layer is disposed on the convex surface, and the third metal layer is disposed on the second insulating layer.

In one or more embodiments of the present application, the carrier substrate is integrally formed.

In one or more embodiments of the present application, the first insulating layer and/or the second insulating layer comprises ceramic.

In one or more embodiments of the present application, the first insulating layer and/or the second insulating layer comprises AlN or SiN.

In one or more embodiments of the present application, projected areas among the second insulating layer, the third metal layer and the convex surface are the same.

The present application proposes a new power module packaging structure with respect to the adverse EMI impact caused by the parasitic capacitance in the existing module packaging technologies, which can reduce the parasitic capacitance between the jumping point and the voltage static point in the power module, thereby greatly reducing the EMI noise of the power module in operation.

Hereinafter, the above disclosure will be described in detail with reference to embodiments, and a further explanation of the technical solution of the present application will be provided.

BRIEF DESCRIPTION OF THE DRAWINGS

A brief description of the drawings is provided as follows, so that the above and other objects, features, advantages and embodiments of the present application can be understood in detail:

FIGS. 7A-7B are schematic diagrams showing the topology structure of the power module of the present application that is applied to a common two-level circuit;

FIGS. 8A-8C are schematic diagrams showing the topology structure of the power module of the present application that is applied to a common three-level circuit;

DETAILED DESCRIPTION OF THE EXEMPLARY EMBODIMENTS

Figure 1:
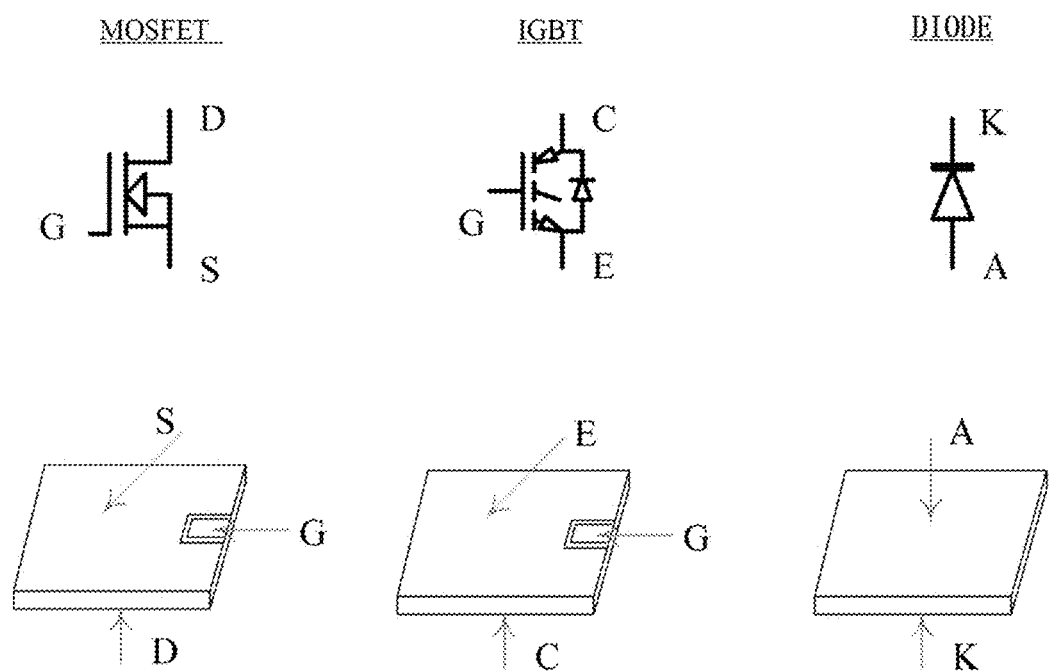
FIG. 1 is a schematic diagram of the basic structure of a common power semiconductor.
Figure 2:
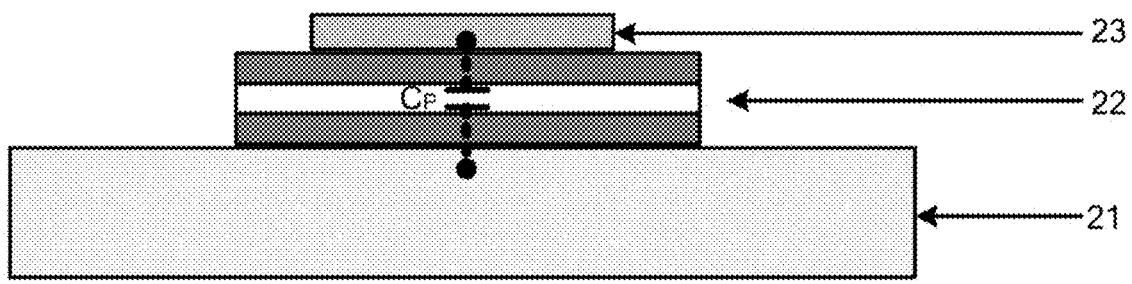
FIG. 2 is a schematic diagram of an existing packaging structure for power module.
Figure 3:
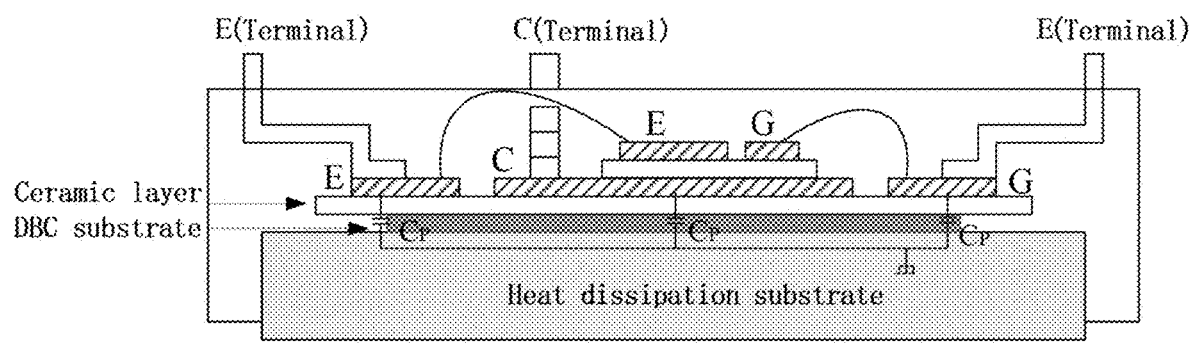
FIG. 3 is a schematic diagram of a packaging structure for an IGBT power module proposed by Chinese Patent Application No. CN104900546.

Reference will be made to the accompanying drawings and the various embodiments to make the explanation of the present application elaborate and complete, and the same numerals in the drawings may represent the same or similar components. On the other hand, well-known components and steps are not described in the embodiments to avoid any unnecessary limitation of the present application. In addition, some of the conventional structures and elements will be shown in simplified illustration for the sake of simplicity of the drawings.

In view of the adverse EMI effects caused by the parasitic capacitance in the existing module packaging technology, the present application provides a novel module packaging technology to reduce the parasitic capacitance between the jumping potential and the voltage static point in a module, such that the EMI noise of the power module in operation can be greatly reduced.

The present application provides a packaging structure for a power module that may include a heat dissipation substrate, at least one first power device, and at least one second power device. The at least one first power device is disposed on a first substrate having an insulating layer, and the first substrate is disposed on the heat dissipation substrate. The at least one second power device includes a jumping electrode having a jumping potential, wherein the at least one second power device is disposed on at least one second substrate having an insulating layer, and the at least one second substrate is disposed on the first substrate to reduce a parasitic capacitance between the jumping electrode and the heat dissipation substrate.

In the present application, the so-called "jumping potential" generally means that there is a relatively great jumping between high level and low level (i.e., for example, a voltage change rate dv/dt is greater than 10 V/µs) relative to a reference point (e.g., a voltage static point). In contrast, if there is a fixed potential or a relatively small jumping between high level and low level (i.e., for example, the voltage change rate dv/dt is less than 2V/µs, which can be regarded as "substantially no jumping") relative to the reference point (e.g., a voltage static point), it is called as "non-jumping potential" (or called as "a voltage static point"). Certainly, it can be understood that the critical values of the above voltage change rate dv/dt, such as 2V/µs and 10V/µs, may also fluctuate within a range of, for example, 10%, 5% or the like, but the present application will not be limited thereto.

Figure 4:
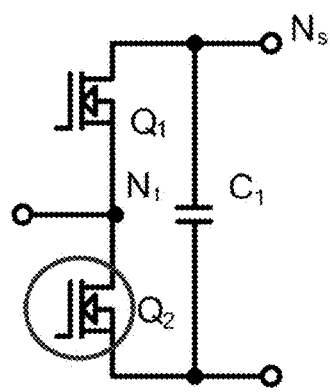
FIG. 4 is a schematic diagram showing the circuit structure of a half bridge arm module packaged by the module packaging technology of the present application.

By taking a simplest half bridge arm module as an example, as shown in FIG. 4, its structure may include: a half bridge arm composed of power devices $Q_1$ and $Q_2$ (such as MOSFET chips), wherein the drain of the power device $Q_2$ is the midpoint Nt of the bridge arm. Due to the switch of the power devices $Q_1$ and $Q_2$ on the bridge arm, the potential at the midpoint Nt of the bridge arm may jump, and the drain (i.e., the midpoint Nt of the bridge arm) of the power device $Q_2$ is a jumping point, that is, the drain of the power device $Q_2$ is a jumping electrode having a jumping potential. The drain of the power device $Q_1$ is directly connected to an input terminal Ns (such as, a positive electrode of a capacitor) and can be regarded as a voltage static point.

Figure 5:
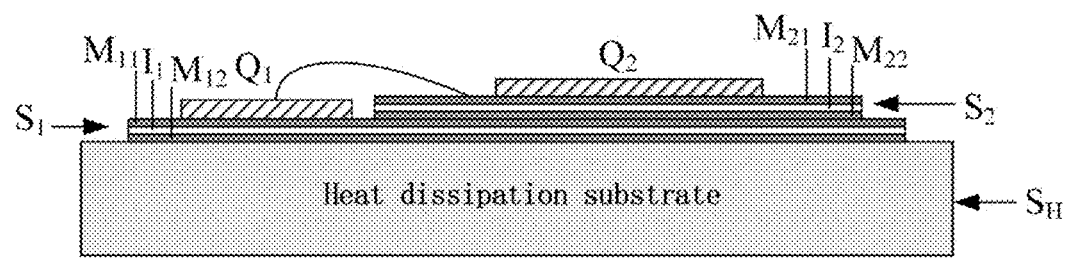
FIG. 5 is a schematic diagram of a packaging structure for a power module obtained by packaging the module shown in FIG. 4.

Therefore, during packaging, as shown in FIG. 5, the lower surface (having the drain D) of the power device $Q_1$ is disposed on a first substrate $S_1$ having an insulating layer, i.e., the lower surface of the power device $Q_1$ is soldered to the first substrate $S_1$; the power device $Q_2$ having a jumping electrode (e.g., the drain D) is disposed on a second substrate $S_2$ having an insulating layer, i.e., the lower surface (having the drain D) of the power device $Q_2$ is soldered to the second substrate $S_2$; and the second substrate $S_2$ is disposed on the first substrate $S_1$, i.e., the second substrate $S_2$ is soldered to the first substrate $S_1$, while the first substrate $S_1$ is disposed on a heat dissipation substrate $S_H$, i.e., the first substrate $S_1$ is soldered to the heat dissipation substrate $S_H$ which is a voltage static point. A parasitic capacitance may be formed between the lower surface of the power device $Q_1$ and the heat dissipation substrate $S_H$ (the voltage static point) through the first substrate $S_1$; however, since the lower surface of the power device $Q_1$ is a drain having a relatively stable potential, the common mode current introduced by the parasitic capacitance will be greatly reduced. The lower surface of the power device $Q_2$ is connected to the heat dissipation substrate $S_H$ via the first substrate $S_1$ and the second substrate $S_2$, such that the parasitic capacitance between the voltage jumping point (such as, the drain of the power device $Q_2$) and the voltage static point (such as, the heat dissipation substrate $S_H$) can be reduced, thereby improving the EMC performance of the power module.

Figure 6A:
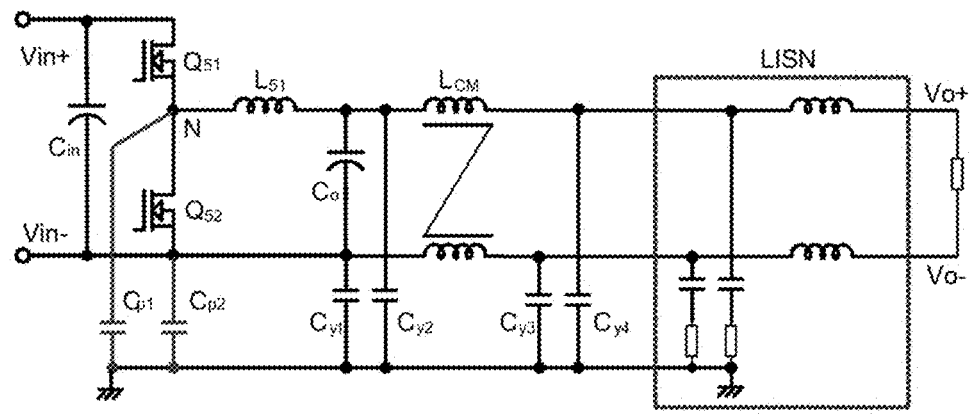
FIG. 6A is a schematic diagram showing a circuit topology of a power module of the present application that is applied to a half bridge circuit.
Figure 6B:
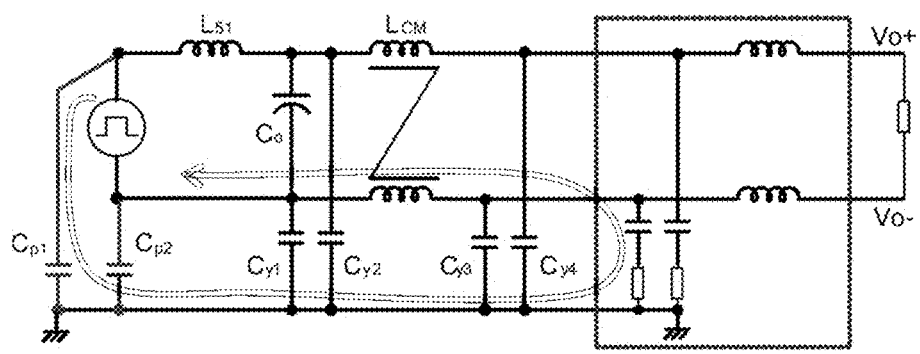
FIG. 6B is an equivalent circuit diagram showing the occurrence of a high frequency jumping of the potential at the midpoint N of the bridge arm when the power module is in a high frequency switching state in FIG. 5.

FIG. 6A is a schematic diagram showing a circuit topology of a power module of the present application that is applied to a half bridge circuit. FIG. 6A shows a topology structure of a half bridge circuit having an output with a first-order common mode inductor $L_{CM}$, and an output positive terminal Vo+ and an output negative terminal Vo− both grounded via capacitors $C_{y1}$-$C_{y4}$, wherein a linear impedance network (LISN) is connected at the output terminals to measure the conducted interference of the entire device. The capacitors $C_{p1}$, $C_{p2}$ in FIG. 6A are the parasitic capacitance introduced and generated by the power module packaging. When the power module is in the high frequency switching state, the potential of the midpoint N of the bridge arm may jump at a high frequency, i.e., the midpoint N of the bridge arm is a jumping point. At this time, in the equivalent circuit as shown in FIG. 6B, the parasitic capacitance $C_{p1}$, $C_{p2}$ may form a common mode current loop (indicated by an arrow in the figure), in which the common mode current may flow through the resistor of the LISN for testing EMI. The parasitic capacitance $C_{p1}$, $C_{p2}$ of the power module packaged by the packaging method of the present application is significantly lower than that of the power module packaged by a conventional packaging method, that is, the adverse effect of the parasitic capacitance $C_{p1}$, $C_{p2}$ on the EMI may be significantly less than the conventional method. In other words, the power module packaged by the packaging method of the present application can effectively alleviate the EMI problem of the power module.

In the above embodiment, the first substrate $S_1$ and the second substrate $S_2$ may each be a DBC substrate having an insulating layer as the middle layer and copper layers as the upper and lower surfaces. The first substrate $S_1$ may be soldered to the heat dissipation substrate $S_H$ with a solder. The insulating layers of the first substrate $S_1$ and the second substrate $S_2$ may comprise ceramic, such as AlN or SiN with high thermal conductivity, such that the power module may have a great effect of heat dissipation. However, it can be understood that the first substrate $S_1$ and the second substrate $S_2$ are not limited to the DBC substrate, and may have other structures. For example, the first substrate $S_1$ may include two metal layers $M_{11}$ and $M_{12}$ disposed on the upper and lower surfaces of the insulating layer $I_1$ of the first substrate $S_1$, respectively. For example, the second substrate $S_2$ may also include two metal layers $M_{21}$ and $M_{22}$ disposed on the upper and lower surfaces of the insulating layer $I_2$ of the second substrate $S_2$, respectively. These metal layers may comprise copper or other metal materials. Moreover, the first substrate $S_1$ may be connected to the heat dissipation substrate $S_H$ in other manners. None of the above are intended to limit the present application.

In the embodiments shown in FIGS. 4 and 5, the power devices $Q_1$ and $Q_2$ are MOSFET chips. However, it can be understood that the power device $Q_1$ and/or the power device $Q_2$ may also be a diode chip or an IGBT chip in other embodiments of the present application, and the circuit structure of the power device is not limited to the circuit structure shown in FIG. 4, which may also have the circuit topology as shown in FIGS. 7A-7B and 8A-8C or other circuit topologies, the present application is not limited thereto. For example, FIGS. 7A-7B illustrate the power module of the present application that is applied to a common two-level circuit topology, and FIGS. 8A-8C illustrate the power module of the present application that is applied to a common three-level circuit topology. The circled portions in these figures are power devices that may affect the system EMI via the parasitic capacitance of the power modules. Therefore, when a power device having a circuit topology as shown in FIGS. 7A-7B and 8A-8C is packaged by the packaging method of the present application, the power devices corresponding to the circled portions in these figures may be disposed on the second substrate $S_2$, and the other power devices may be disposed on the first substrate $S_1$ which is connected to the heat dissipation substrate $S_H$, such that the parasitic capacitance between the voltage jumping point and the voltage static point in the topology can be reduced, thereby improving the EMC performance of the entire system.

Moreover, when the power device is a diode chip, the anode A of the diode chip may be positioned on an upper surface of the diode chip, and the kathode K of the diode chip may be positioned on a lower surface of the diode chip. When the power device is an IGBT chip, the emitter E and the gate G of the IGBT chip may be positioned on an upper surface of the IGBT chip, and the collector C of the IGBT chip may be positioned on a lower surface of the IGBT chip. When the power device is a MOSFET chip, the source S and the gate G of the MOSFET chip may be positioned on an upper surface of the MOSFET chip, and the drain D of the MOSFET chip may be positioned on a lower surface of the MOSFET chip.

Accordingly, the packaging structure of the power module according to the present application can ensure that the upper metal layer of the first substrate $S_1$ is a voltage static point (i.e., for example, the drain of the power device $Q_1$ in FIG. 5 is a voltage static point) by disposing a chip having a jumping electrode (e.g., the drain D, the kathode K, the collector C or the like) with a jumping potential on the upper surface of an additional substrate (i.e., the second substrate). Although the parasitic capacitance between the upper metal layer of the first substrate $S_1$ and the heat dissipation substrate $S_H$ (i.e., a voltage static point) cannot be avoided, the common mode current and the common mode interference effect caused by the parasitic capacitance will be greatly reduced because the upper metal layer of the first substrate $S_1$ is no longer a potential jumping point. Meanwhile, the packaging structure of the present application can achieve a better effect of heat dissipation as compared with the existing module packaging structure, because the power device $Q_2$ is connected to the heat dissipation substrate $S_H$ via the two substrates $S_1$ and $S_2$ and the insulating layers inside the two substrates $S_1$ and $S_2$ may be made from thermally conductive ceramics such as AlN and SiN.

Figure 9:
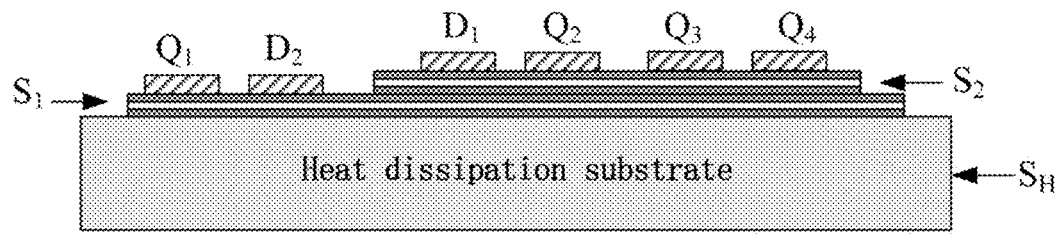
FIG. 9 is a schematic diagram of a packaging structure obtained by packaging a topology circuit of the power module shown in FIG. 8A using the module packaging technology of the present application.

FIG. 9 shows a packaging structure obtained by packaging a topology circuit of the power module shown in FIG. 8A using the module packaging technology of the present application. As shown in FIG. 9, the power devices (e.g., the diode chip $D_1$, the IGBT chip $Q_2$, the IGBT chip $Q_3$, and the IGBT chip $Q_4$) each having a jumping electrode with a jumping potential are disposed on the second substrate $S_2$, the power devices (e.g., the diode chip $D_2$ and the IGBT chip $Q_1$) each having a stable potential are disposed on the first substrate $S_1$, and the second substrate $S_2$ is disposed on the first substrate $S_1$ which is disposed on the heat dissipation substrate $S_H$, in order to ensure that the upper metal layer of the first substrate $S_1$ is a voltage static point, that is, not a potential jumping point, such that the common mode current and the common mode interference effect caused by the parasitic capacitance between the upper metal layer of the first substrate $S_1$ and the heat dissipation substrate $S_H$ (the voltage static point) are greatly reduced, thereby improving the EMC performance of the entire system.

Preferably, the present application further provides another packaging structure for a power module, comprising a heat dissipation substrate, at least one first power device, at least one second power device, and a carrier substrate. The at least one second power device may comprise a jumping electrode with a jumping potential. The carrier substrate may include a first metal layer, a second metal layer, a first insulating layer, a second insulating layer, and a third metal layer, wherein the first insulating layer may be disposed between the first metal layer and the second metal layer, the second insulating layer may be disposed between the second metal layer and the third metal layer. Moreover, the first metal layer may be disposed on the heat dissipation substrate, the at least one first power device may be disposed on the second metal layer, and the at least one second power device may be disposed on the third metal layer, such that the parasitic capacitance between the jumping electrode and the heat dissipation substrate can be reduced.

Figure 10:
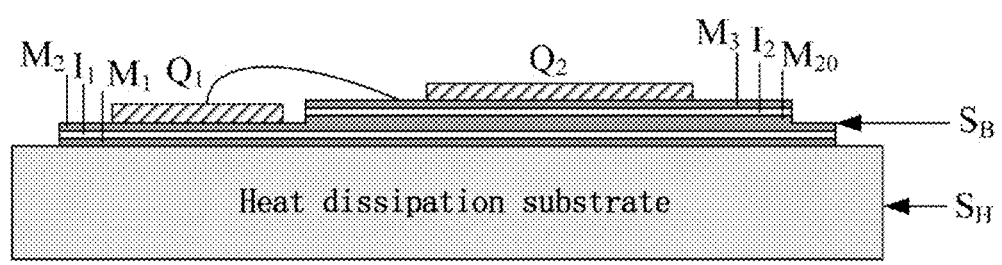
FIG. 10 shows another preferred packaging structure for power module obtained by packaging the module shown in FIG. 4 using another module packaging technology of the present application.

FIG. 10 shows another preferred packaging structure for power module obtained by packaging the module shown in FIG. 4 using another module packaging technology of the present application. As shown in FIG. 10, unlike the embodiment shown in FIG. 5, the carrier substrate $S_B$ is integrally formed and includes a first metal layer $M_1$, a second metal layer $M_2$, a first insulating layer $I_1$, a second insulating layer $I_2$ and a third metal layer $M_3$, and a convex surface $M_{20}$ is formed on a portion of the upper surface of the second metal layer $M_2$. The second insulating layer $I_2$ is disposed on the convex surface $M_{20}$, and the third metal layer $M_3$ is disposed on the second insulating layer $I_2$. Preferably, projected areas among the second insulating layer $I_2$, the third metal layer $M_3$, and the convex surface $M_{20}$ are the same. Preferably, the first insulating layer $I_1$ and/or the second insulating layer $I_2$ may comprise ceramic, such as AlN or SiN.

The packaging structure for a power module according to the present application can effectively reduce the parasitic capacitance between the jumping potential and the voltage static point in the power module and thereby greatly reduce the EMI noise of the power module in operation, such that the integrated power module of the present application can be used in a high power electronic device to increase power density.

While the present application has been disclosed in the above embodiments, the embodiments are not intended to limit the present application, and various changes and modifications may be made to the present application by any person skilled in the art without departing from the spirit and scope of the present application. The protection scope of the present application is defined by the appended claims.

The invention claimed is:

1. A packaging structure for a power module, comprising:
a heat dissipation substrate;
at least one first power device disposed on a first substrate having an insulating layer, the first substrate disposed on the heat dissipating substrate; and
at least one second power device including a jumping electrode having a jumping potential, wherein the at least one second power device is disposed on at least one second substrate having an insulating layer, and the at least one second substrate is disposed on the first substrate, to reduce a parasitic capacitance between the jumping electrode and the heat dissipation substrate.

2. The packaging structure for the power module according to claim 1, wherein the first substrate is a DBC substrate; and the at least one second substrate is a DBC substrate.

3. The packaging structure for the power module according to claim 1, wherein the first substrate further comprises two metal layers disposed on an upper surface and a lower surface of the insulating layer of the first substrate, respectively.

4. The packaging structure for the power module according to claim 1, wherein the at least one second substrate further comprises two metal layers disposed on an upper surface and a lower surface of the insulating layer of the at least one second substrate, respectively.

5. The packaging structure for the power module according to claim 1, wherein the insulating layer of the first substrate comprises ceramic; and the insulating layer of the at least one second substrate comprises ceramic.

6. The packaging structure for the power module according to claim 1, wherein the insulating layer of the first substrate comprises AlN or SiN; and the insulating layer of the at least one second substrate comprises AlN or SiN.

7. The packaging structure for the power module according to claim 1, wherein the at least one first power device is a diode chip having an anode on an upper surface of the diode chip and a kathode on a lower surface of the diode chip; or the at least one first power device is an IGBT chip having an emitter and a gate on an upper surface of the IGBT chip and a collector on a lower surface of the IGBT chip; or the at least one first power device is a MOSFET chip having a source and a gate on an upper surface of the MOSFET chip and a drain on a lower surface of the MOSFET chip.

8. The packaging structure for the power module according to claim 1, wherein the at least one second power device is a diode chip having an anode on an upper surface of the diode chip and a kathode on a lower surface of the diode chip; or the at least one second power device is an IGBT chip having an emitter and a gate on an upper surface of the IGBT chip and a collector on a lower surface of the IGBT chip; or the at least one second power device is a MOSFET chip having a source and a gate on an upper surface of the MOSFET chip and a drain on a lower surface of the MOSFET chip.

9. The packaging structure for the power module according to claim 3, wherein the metal layer comprises copper.

10. The packaging structure for the power module according to claim 4, wherein the metal layer comprises copper.

11. The packaging structure for the power module according to claim 1, wherein the first substrate is soldered to the heat dissipation substrate with a solder.

12. A packaging structure for a power module, comprising:
a heat dissipation substrate;
at least one first power device;
at least one second power device including a jump electrode having a jumping potential; and
a carrier substrate including a first metal layer, a second metal layer, a first insulating layer, a second insulating layer and a third metal layer, the first insulating layer disposed between the first metal layer and the second metal, the second insulating layer disposed between the second metal layer and the third metal layer;
wherein the first metal layer is disposed on the heat dissipation substrate, the at least one first power device is disposed on the second metal layer, and the at least one second power device is disposed on the third metal layer, to reduce a parasitic capacitance between the jumping electrode and the heat dissipation substrate.

13. The packaging structure for the power module according to claim 12, wherein a portion of an upper surface of the second metal layer has a convex surface, the second insulating layer is disposed on the convex surface, and the third metal layer is disposed on the second insulating layer.

14. The packaging structure for the power module according to claim 12, wherein the carrier substrate is integrally formed.

15. The packaging structure for the power module according to claim 12, wherein the first insulating layer and/or the second insulating layer comprises ceramic.

16. The packaging structure for the power module according to claim 12, wherein the first insulating layer and/or the second insulating layer comprises AlN or SiN.

17. The packaging structure for the power module according to claim 13, wherein projected areas among the second insulating layer, the third metal layer and the convex surface are the same.

* * * * *